(12) United States Patent
Albert et al.

(10) Patent No.: US 9,329,497 B2
(45) Date of Patent: May 3, 2016

(54) SUBSTRATE TABLE, LITHOGRAPHIC APPARATUS AND DEVICE MANUFACTURING METHOD

(75) Inventors: Bensely Albert, Atlanta, GA (US); Rene Theodorus Petrus Compen, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 279 days.

(21) Appl. No.: 13/979,278

(22) PCT Filed: Nov. 17, 2011

(86) PCT No.: PCT/EP2011/070407
§ 371 (c)(1),
(2), (4) Date: Jul. 11, 2013

(87) PCT Pub. No.: WO2012/103967
PCT Pub. Date: Aug. 9, 2012

(65) Prior Publication Data
US 2013/0301028 A1    Nov. 14, 2013

Related U.S. Application Data

(60) Provisional application No. 61/438,480, filed on Feb. 1, 2011.

(51) Int. Cl.
*G03F 7/20* (2006.01)
*H01L 21/687* (2006.01)
*C23C 16/44* (2006.01)
*C23F 1/00* (2006.01)

(52) U.S. Cl.
CPC ............ *G03F 7/70716* (2013.01); *C23C 16/44* (2013.01); *C23F 1/00* (2013.01); *H01L 21/6875* (2013.01)

(58) Field of Classification Search
CPC ....... C23C 16/44; C23F 1/00; G03F 7/70716; G03F 7/707; H01L 21/6875
USPC ....................................... 355/72, 75
See application file for complete search history.

(56) References Cited

U.S. PATENT DOCUMENTS

| | | | |
|---|---|---|---|
| 4,551,192 A * | 11/1985 | Di Milia et al. | 156/345.51 |
| 5,298,103 A | 3/1994 | Steinberg et al. | |
| 5,841,624 A * | 11/1998 | Xu | H01L 21/6831 279/128 |
| 6,413,701 B1 * | 7/2002 | van Empel et al. | 430/320 |

(Continued)

FOREIGN PATENT DOCUMENTS

| | | |
|---|---|---|
| JP | H07-003432 A | 1/1995 |
| JP | H07-138771 A | 5/1995 |

(Continued)

OTHER PUBLICATIONS

International Search Report directed to related International Patent Application No. PCT/EP2011/070407, mailed Dec. 29, 2011; 3 pages.

(Continued)

*Primary Examiner* — Steven H Whitesell Gordon
(74) *Attorney, Agent, or Firm* — Sterne, Kessler, Goldstein & Fox P.L.L.C.

(57) ABSTRACT

A substrate table comprising a base and a plurality of burls that project from the base, wherein an upper surface of the burls is provided with a multilayer coating.

15 Claims, 4 Drawing Sheets

(56) References Cited

U.S. PATENT DOCUMENTS

| | | | |
|---|---|---|---|
| 7,592,249 | B2 | 9/2009 | Maekawa |
| 2004/0221798 | A1 | 11/2004 | Sherman |
| 2005/0030515 | A1* | 2/2005 | Ottens .................. G03F 7/707 355/99 |
| 2005/0117141 | A1* | 6/2005 | Ottens et al. .................. 355/75 |
| 2008/0301592 | A1* | 12/2008 | Voldman .................. 716/2 |
| 2009/0060688 | A1 | 3/2009 | Asada |
| 2009/0284894 | A1 | 11/2009 | Cooke |
| 2010/0096262 | A1 | 4/2010 | Aruga et al. |
| 2010/0255625 | A1 | 10/2010 | De Vries |

FOREIGN PATENT DOCUMENTS

| | | | |
|---|---|---|---|
| JP | H07-207459 A | | 8/1995 |
| JP | H10-076407 A | | 3/1998 |
| JP | H10-076408 A | | 3/1998 |
| JP | 2000-349140 A | | 12/2000 |
| JP | 2007-158286 A | | 6/2007 |
| JP | 2008-135736 A | | 6/2008 |
| JP | 2008-211119 A | | 9/2008 |
| JP | 2008-218802 A | | 9/2008 |
| JP | 2010-034256 A | | 2/2010 |
| JP | 2010-538165 A | | 12/2010 |
| WO | WO 2009/047867 A1 | | 4/2009 |

OTHER PUBLICATIONS

International Preliminary Report on Patentability and Written Opinion of the International Searching Authority directed to related to International Patent Application No. PCT/EP2011/070407, mailed Aug. 6, 2013; 8 pages.

Allen, L.N, et al., "Final surface error correction of an off-axis aspheric petal by ion figuring," Proceedings of SPIE, Active and Adaptive Optical Components, vol. 1543, 1991; pp. 190-200.

Barron, A.R, "Atomic Layer Deposition," accessed at http://cnx.org/content/m25737/latest, accessed on Oct. 29, 2013; 6 pages.

Burge, J.H., et al., "Development of optimal grinding and polishing tools for aspheric surfaces," Proceedings of SPIE, Optical Manufacturing and Testing IV, vol. 4451, 2001; pp. 153-164.

du Jeu, C., "Criterion to appreciate difficulties of Aspherical polishing," Proceedings of SPIE, Optical Fabrication, Metrology, and Material Advancements for Telescopes, vol. 5494, 2004; pp. 113-121.

Fähnle, O.W., et al., "Fluid jet polishing of optical surfaces," Applied Optics, vol. 37, No. 28, Oct. 1998, pp. 6771-6773.

Getty, J.D., et al., "How Plasma-Enhanced Surface Modification Improves the Production of Microelectronics and Optoelectronics," Chip Scale Review, Jan.-Feb. 2002; pp. 72-75.

Golini, D., et al., "Magnetorheological finishing (MRF) in commercial precision optics manufacturing," SPIE Conference on Optical Manufacturing and Testing III, vol. 3782, Jul. 1999; pp. 80-91.

Holmberg, K., et al., "Properties, Mechanisms, Techniques and Applications in Surface Engineering," Section 4.3.8—Multilayer coatings, first printing dated 1994; p. 241.

Jones, R.A., "Optimization of computer controlled polishing," Applied Optics, vol. 16, No. 1, Jan. 1977; pp. 218-224.

Lackner, J.M., et al., "Nanocrystalline Cr/CRN and Ti/TiN multilayer coatings produced by pulsed laser deposition at room temperature," Bulletin of the Polish Academy of Sciences, Technical Sciences, vol. 54, No. 2, 2006; pp. 175-180.

Leech, P.W., et al., "Reactive ion etching of TiN, TiAlN, CrN and TiCN Films in $CF_4/O_2$ and $CHF_3/O_2$ Plasmas," Materials Research Society Symposium Proceedings, vol. 890, 2006; pp. 0890-Y08-13.1 to 0890-Y08-13.6.

Major, B., et al., "Surface engineering in formation of modern multilayer structures—biofunctional hydroxyapatite coatings produced by pulsed laser ablation and grow discharge nitriding multiplex method," Bulletin of the Polish Academy of Sciences, Technical Sciences, vol. 52, No. 4, 2004; pp. 283-290.

Putkonen, M., et al., "Increasing the glass cracking resistance by atomic layer deposition," Proceedings of $7^{th}$ International Conference on Coatings on Glass and Plastics, Jun. 15-19, 2008; pp. 375-376.

Ras, R.H.A., et al., "Blocking the Lateral Film Growth at the Nanoscale in Area-Selective Atomic Layer Deposition," Journal of the American Chemical Society, vol. 140, 2008; pp. 11252-11253.

"SRT 3: Controlled surface roughness," EUVlitho.net, S.P.A.M. FP7 Marie Curie Research and Initial Training Network, accessed at http://www.euvlitho.net/internet/Page/123259_srt-3.aspx, accessed on Oct. 29, 2013; 1 page.

Tonotani, J., et al., "Dry etching characteristics of TiN film using $AR/CHF_3$, $Ar/Cl_2$, and $AR/BCl_3$ gas chemistries in an inductively coupled plasma," Journal of Vacuum Science and Technology, vol. 21, No. 5, Sep./Oct. 2003; pp. 2163-2166.

Wagner, C., et al., "EUV into production with ASML's NXE platform," Proceedings of SPIE, Extreme Ultraviolet (EUV) Lithography, vol. 7636, 2010; pp. 76361H-1 to 76361H-12.

Wilson, S.R., et al., "Surface figuring using neutral ion beams," Proceedings of SPIE, Advances in Fabrication and Metrology for Optics and Large Optics, vol. 966, 1988; pp. 74-81.

Yi, S., et al., "Bonding strengths at plastic encapsulant—gold-plated copper leadframe interface," Microelectronics Reliability, vol. 40, No. 7, 2000; pp. 1207-1214.

Zarowin, C.B., "Comparison of the smoothing and shaping of optics by plasma-assisted chemical etching and ion milling using the surface evolution theory," Applied Optics, vol. 32, No. 16, Jun. 1993; pp. 2984-2991.

"Atomic Layer Deposition: FlexAL® and OpAL™," Ref. No. OIPT/ALD/2008/01, Oxford Instruments Plasma Technology, Ltd., 2008; 8 pages.

"Table 9.5: Overview of some important ALD of TiN," Chemical Vapour Deposition Precursors, Processes and Applications, Chapter 9, 2009; p. 424.

* cited by examiner

SUBSTRATE TABLE, LITHOGRAPHIC APPARATUS AND DEVICE MANUFACTURING METHOD

CROSS-REFERENCE TO RELATED APPLICATIONS

This application claims the benefit of U.S. provisional No. 61/438,480, which was filed Feb. 1, 2011, and which is incorporated herein in its entirely by reference.

BACKGROUND OF THE INVENTION

1. Field of the Invention

The present invention relates to a substrate table, to a lithographic apparatus, and to a device manufacturing method.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nanometers (nm), for example within the range of 13-14 nm, or example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

EUV lithographic apparatus are capable of projecting patterns having a critical dimension of a 27 nm or less, and may be capable of achieving overlay with an accuracy of 5 nm or less. When operating at these critical dimensions and overlays, it is desirable that a substrate table which, holds a substrate during projection of a pattern, is substantially flat. This is because a substrate table that includes significant non-flatness may cause bending of the substrate, which may lead to an overlay error and/or a focussing error.

BRIEF SUMMARY OF THE INVENTION

It is desirable to provide a substrate table that overcomes or mitigates a disadvantage of the prior art, whether identified here or elsewhere.

According to a first an aspect of the invention, there is provided a substrate table comprising a base and a plurality of burls that project from the base, wherein an upper surface of the burls is provided with a multilayer coating.

According to a second aspect of the invention, there is provided a lithographic apparatus comprising the substrate table of the first aspect of the invention. The lithographic apparatus may be a lithographic projection apparatus.

According to a third aspect of the invention there is provided a method of forming a multilayer coating on a substrate table. This method comprises using atomic layer deposition to form a layer of a first material on the substrate table, then using atomic layer deposition to form a layer of a second material on top of the layer of the first material, optionally, followed by atomic layer deposition to form additional layers of material on the substrate table.

According to a fourth aspect of the invention there is provided a method of forming burls on a substrate table. This method comprises forming sites, which will receive material during atomic layer deposition, the sites being surrounded by regions that will not receive material during atomic layer deposition, then forming a multilayer coating on the sites using atomic layer deposition, and thereby forming burls on the substrate table.

According to a fifth aspect of the invention there is provided a method of providing roughness to an upper surface of a coating on burls of a substrate table, the method comprising etching the coating using plasma etching.

BRIEF DESCRIPTION OF THE DRAWINGS/FIGURES

Embodiments of the invention will now be described, by way of example only, with reference to the accompanying schematic drawings in which corresponding reference symbols indicate corresponding parts, and in which.

DETAILED DESCRIPTION OF THE INVENTION

Figure 1:
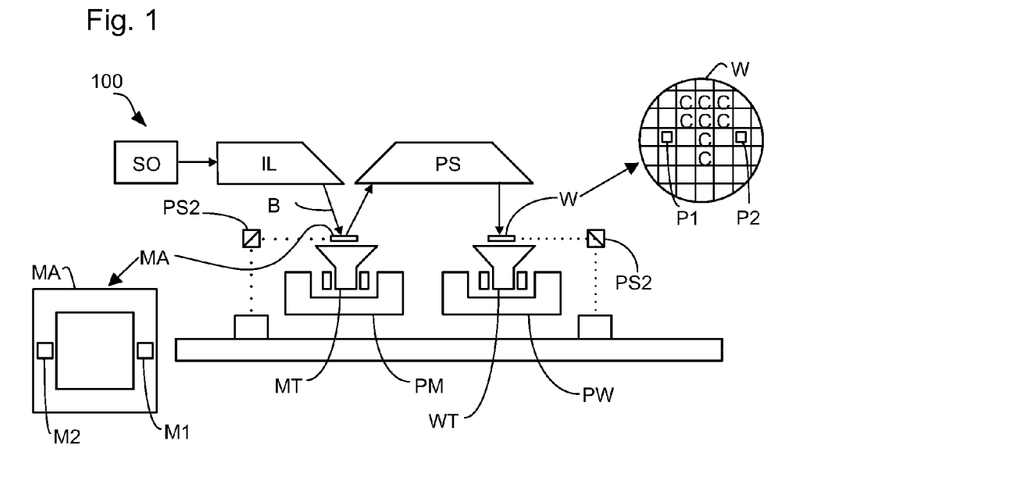
FIG. 1 depicts a lithographic apparatus according to an embodiment of the invention.

FIG. 1 schematically depicts a lithographic apparatus 100 including a source collector module SO according to one embodiment of the invention. The apparatus comprises:

an illumination system (illuminator) IL configured to condition a radiation beam B (e.g., EUV radiation);

a support structure (e.g., a mask table) MT constructed to support a patterning device (e.g., a mask or a reticle) MA and connected to a first positioner PM configured to accurately position the patterning device;

a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet (EUV) radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
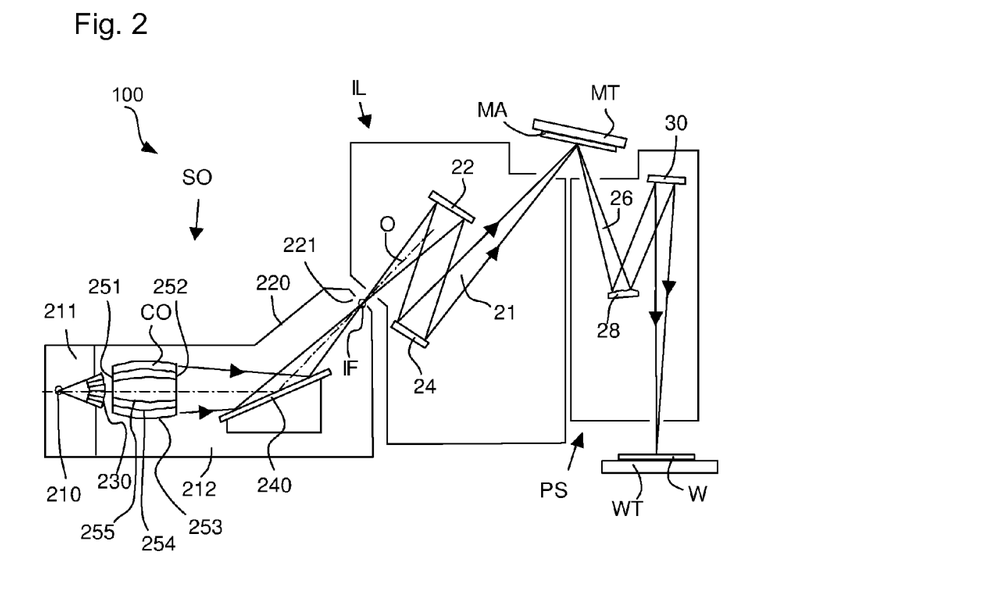
FIG. 2 is a more detailed view of the lithographic apparatus of FIG. 1, including a DPP source collector module SO.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently, the radiation traverses the illumination system IL, which may include a facetted field mirror device 22 and a facetted pupil mirror device 24 arranged to provide a desired angular distribution of the radiation beam 21. At the patterning device MA, as well as a desired uniformity of radiation intensity at the patterning device MA. a Patterned beam 26 is formed upon reflection of the beam of radiation 21 at the patterning device MA, held by the support structure MT. The patterned beam 26 is imaged by the projection system PS via reflective elements 28, 30 onto a substrate W, which is held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source (often called a DPP source).

Figure 3:
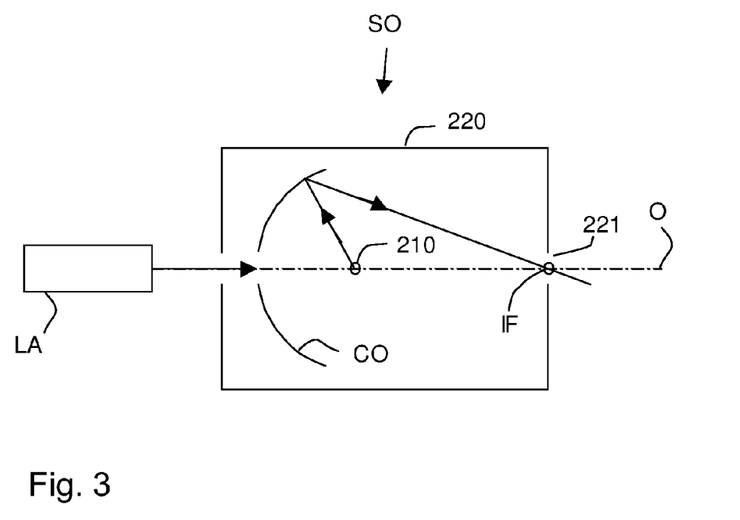
FIG. 3 is a view of an alternative source collector module SO of the apparatus of FIG. 1, the alternative being a LPP source collector module.

Alternatively, the source collector module SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The substrate table WT (see FIGS. 1 and 2) includes multiplicity of protrusions, which extend upwardly from an upper surface of the substrate table. These protrusions are commonly referred to as burls. Burls, which are known in the prior art, reduce the area of contact between the substrate table WT and a substrate W. In addition, burls provide a space into which contamination particles may fall, thereby reducing the likelihood that a substrate W will be distorted by a contamination particle trapped between the substrate table WT and the substrate.

Figure 4:
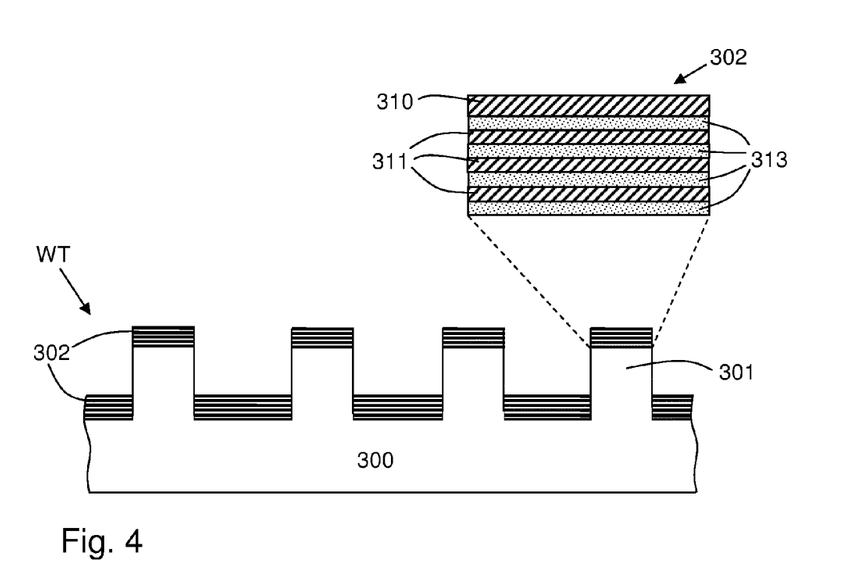
FIG. 4 depicts a substrate table according to an embodiment of the invention.

Part of a substrate table WT that embodies the invention is shown schematically in FIG. 4. The substrate table comprises a base 300 and burls 301, which extend upwardly from the base. The burls 301 may, for example, be separated from one another by 2-3 mm (or may have some other separation). The substrate table may be formed from AF 32 glass, which is available from Schott AG of Mainz, Germany. An upper surface of the base 300 and an upper surface of the burls is covered by a multilayer coating 302 which has been formed using pulsed laser deposition (PLD). The multilayer coating 302 provided on top of one of the burls 301 is shown in an expanded view on the right hand side of FIG. 4.

The multilayer coating 302 comprises four layers of TiN 310, 311, and four layers of Ti 313, the upper layer of the coating being TiN 310 and the lower layer of the coating being Ti 313. Each of the layers of Ti 313 may have the same thickness (although they may have different thicknesses). With the exception of the upper layer 310, each of the layers of TiN 311 may have the same thickness (although they may have different thicknesses). The upper layer of TiN 310 may have a greater thickness than the other layers of TiN 311, as is shown schematically in FIG. 4. In an embodiment, the layers of TiN 311 (except for the upper layer 310) may for example each have a thickness of 30 nm. The upper layer of TiN 310 may for example have a thickness of 100 nm. The layers of Ti 313 may, for example, each have a thickness of 30 nm.

Pulsed laser deposition (PLD) is capable of forming layers of material, which have a minimum thickness of 30 nm. This gives rise to the 30 nanometer thicknesses mentioned above. However, PLD is capable of forming layers of material which have a thickness greater than 30 nm, and the layers of the multilayer coating 302 may thus have thicknesses which are greater than 30 nm. Different layers of the multilayer coating 302 may have different thicknesses.

Although the multilayer coating 302 shown in FIG. 4 has eight layers, the multilayer coating may have any suitable number of layers. The number of layers may for example be as little as two, and may be as great as sixty four or more. The multilayer coating may for example comprise ten or more layers, twenty or more layers, or thirty or more layers. For example, it may be desired to form the multilayer coating with a thickness of around 1 micron. Where this is the case, if the upper layer is 100 nm thick and the remaining layers are 30 nm thick, then the multilayer coating 302 may comprise around thirty layers. This would comprise fifteen layers of Ti, each layer being 30 nm thick, and fifteen layers of TiN, fourteen of the TiN layers being 30 nm thick and the fifteenth layer (the upper layer) being 100 nm thick.

Although the multilayer coating 302 is not shown in FIG. 4 as being provided on sides of the burls, the multilayer coating may be provided on sides of the burls.

In a lithographic apparatus a multiplicity of substrates may be patterned per hour (e.g., between 60 and 200 substrates per hour). When a substrate is to be patterned it must first be placed on to the substrate table WT. The substrate is removed from the substrate table WT once it has been patterned, and is replaced with a new substrate to be patterned. Over time many thousands of substrates will be placed on the substrate table WT and will be removed from the substrate table. This will cause the burls 301 of the substrate table WT to become worn. This in turn may reduce the flatness of the substrate table, and may consequently reduce the overlay accuracy of the lithographic apparatus. The multilayer coating 302 is significantly harder than AF 32 glass, and is therefore significantly more resistant to wearing. Wearing of the burls due to substrates being placed on the substrate table WT and removed from the substrate table is therefore reduced when the multilayer coating 302 is present on the substrate table.

If a TiN coating on a substrate table were to be worn away by substrates over time, then the AF 32 glass of the substrate table would be exposed. Since the AF 32 glass is significantly softer than TiN, the AF 32 glass of the substrate table WT would become worn quickly once it had become exposed, leading to an unacceptable non-flatness of the substrate table.

For this reason, it is desirable to provide the TiN coating as a thick coating (e.g., as a 1 micron layer of TiN). However, when TiN is provided as a thick coating this may generate residual stresses (sometimes referred to as internal stresses), which is are large that they may cause failure of the coating.

An advantage of providing a multilayer coating 302 on the substrate table WT instead of a single layer is that the coating may be made thicker without failure of the coating. Although residual stress may be present in the multilayer coating 302 and this may cause a crack to form in the coating, the crack will propagate between layers of the multilayer coating, dissipating energy at interfaces between layers of the coating. The dissipation of the energy of the crack at layer to layer interfaces as it travels upwards in the multilayer coating 302 helps to prevent the crack from reaching the upper layer of the multilayer coating with sufficient energy to cause damage to the upper layer. This helps to prevent or reduce damage of the upper layer and improve its resistance to fatigue, thereby prolonging the life of the upper layer (compared with the life of a single layer coating having the same thickness).

When a substrate is placed on the substrate table WT it is electrostatically clamped to the substrate table before exposure of a pattern onto the substrate. When the substrate is electrostatically clamped to the substrate table WT the burls on the wafer table will experience the load generated by the clamping. This load may be borne more readily by a multilayer 302 coating than a single layer coating.

The multilayer coating 302 may for example have a thickness in excess of 100 nm. The multilayer coating 302 may for example have a thickness which is less than 1 micron. The multilayer coating 302 may for example have a thickness which is between 1 micron and 2 microns. The multilayer coating 302 may for example have a thickness that is greater than 2 microns.

In the multilayer coating 302, the TiN 310, 311 is harder and stiffer than the Ti 313. This difference in hardness and stiffness may be taken into account when determining the structure of the multilayer coating 302. For example, the upper layer 310 of the coating may be formed from TiN in order to take advantage of its hardness (TiN will be more resistant to wear than Ti). Ti may bond to the substrate table WT more effectively than TiN. For this reason the lowermost layer of the multilayer coating 302 may be formed from Ti.

It may be desirable to provide the multilayer coating 302 with a degree of resilience such that the multilayer coating undergoes a degree of compression when a substrate W is placed on the substrate table WT, and then returns to its initial configuration. This provides a degree of cushioning when the substrate W is placed on the substrate table WT, which may help to reduce damage to the multilayer coating 302 (thereby improving the durability of the multilayer coating). It may also be desirable to avoid that the multilayer coating 302 is so soft that the multilayer coating does not properly return to its original configuration after a substrate has been clamped to the substrate table. (This would have a detrimental effect on the flatness of the substrate table WT.) In the multilayer coating 302 the Ti is softer than the TiN, and provides resilience in the multilayer coating. The TiN is harder than the Ti and provides rigidity. If it is desired to provide a softer more resilient multilayer coating 302, then the proportion of Ti relative to TiN may be increased. If it is desired to provide a harder less resilient multilayer coating 302 then the proportion of Ti relative to TiN may be reduced.

Plural example multilayer coatings may be created, and properties of those coatings may be tested. An iterative process of creating and testing multilayer coatings may be used to obtain a multilayer coating with desired properties. Different multilayer coatings may for example be provided on different substrate tables, and the wear resistance of the coatings over a predetermined period of time may be monitored. The lifetime of the multilayer coating (i.e., the time before the multilayer coating must be repaired or replaced) may also be monitored.

The TiN upper layer 310 of the multilayer coating 302 will be worn down over time. If it becomes worn away then the uppermost layer 313 of Ti will become exposed. Since Ti is significantly softer than TiN it will wear more quickly than TiN, and this would be likely to lead to problems (e.g., non-flatness) with the substrate table WT. It is for this reason that the upper layer 310 of TiN may be made thicker than other layers of the multilayer coating 302. The upper layer of TiN may for example have a thickness of around 50 nm or greater, or may for example have a thickness of around 100 nm or greater. When the upper layer of TiN has become worn away, new TiN may be applied to form a replacement upper TiN layer.

In an alternative embodiment, the multilayer coating may be formed from CrN and Cr instead of being formed from TiN and Ti (e.g., in the form shown in FIG. 4). The properties of CrN and Cr are analogous to the properties of TiN and Ti. That is, CrN is harder than Cr, and Cr provides more resilience than CrN. The CrN and Cr multilayer coating may thus be formed in an analogous manner to the TiN and Ti coating. For example, a CrN layer may be provided as an upper layer, and a series of Cr and CrN layers may be provided beneath the upper layer. The lower layer may be Cr, since this may provide more effective bonding to the substrate table WT than CrN.

CrN has lower residual stresses (sometimes referred to as internal stresses) than TiN, and thus may be provided in a thicker layer than TiN. Nevertheless, it may still be desirable to provide CrN with Cr in a multilayer coating for the reasons explained above (e.g., to provide resilience and to dissipate the energy of cracks before they reach the uppermost layer). Properties of the coating may be selected by using appropriate proportions of CrN and Cr. CrN may be less desirable than TiN in some instances because it has a lower micro-hardness.

In an embodiment, the layers of CrN (except for the upper layer) may for example each have a thickness of 30 nm. The layers of Cr may for example each have a thickness of 30 nm.

The CrN/Cr multilayer coating may be formed using pulsed laser deposition (PLD). As mentioned further above, PLD is capable of forming layers of material which have a minimum thickness of 30 nm. This gives rise to the 30 nanometer layer thicknesses mentioned above. However, the layers of the multilayer coating may have thicknesses greater than 30 nm. Different layers of the multilayer coating 302 may have different thicknesses.

Since the residual stresses in CrN are smaller than the residual stresses in TiN, the upper layer of CrN may be thicker than the upper layer of TiN in an equivalent structure. The upper layer of CrN may for example have a thickness of around 100 nm or greater, may for example have a thickness of around 200 nm or greater, or may for example have a thickness of around 500 nm or greater. The upper layer of CrN may for example have a thickness of around 1 micron. When the upper layer of CrN has become worn away, new CrN may be applied to form a replacement upper CrN layer.

The multilayer coating may for example have a thickness in excess of 200 nm. The multilayer coating may for example have a thickness that is less than 1 micron. The multilayer coating may for example have a thickness that is between 1 micron and 2 microns. The multilayer coating may for example have a thickness that is greater than 2 microns.

The CrN with Cr multilayer coating may have any suitable number of layers. The number of layers may for example be as little as two, and may be as great as sixty four or more. The multilayer coating may for example comprise, ten or more layers, twenty or more layers, or thirty or more layers.

The multilayer coating 302 may consist of two or more layers of CrN (or TiN) and two or more layers of Cr (or Ti), may consist of four or more layers of CrN (or TiN) and four or more layers of Cr (or Ti), or may consist of sixteen or more layers of CrN (or TiN) and sixteen or more layers of Cr (or Ti). The ratio of Ti to TiN or Cr to CrN may be 1:1, or may be some other ratio (taking into account the properties discussed further above).

The CrN or TiN may include small sizes of columnar crystallites and a high defect density. These may increase the hardness of the CrN or TiN. The Cr or Ti may comprise a columnar structure, which is larger and has less defects (compared with the CrN or TiN), and this may improve the toughness of the coating.

The multilayer coating 302 may comprise grains that are smaller than the grains in a conventional substrate table coating. These smaller grains may be created by forming the multilayer coating at room temperature (as opposed to the conventional process of forming a single layer coating at high temperature). The smaller grains of the multilayer coating may improve the durability of the multilayer coating (compared with a conventionally formed coating having larger grains). In general, the multilayer coating 302 may provide superior tribological properties than a single layer coating.

As mentioned above, the multilayer coating 302 may for example be formed using pulsed laser deposition (PLD), which may be performed at room temperature. A PLD apparatus that may be used to form the multilayer coating is available from PVD Products Inc. of Massachusetts, USA. This may be more desirable than PVD or CVD coating techniques, since those techniques may require the temperature of the substrate table to be in excess of 200° C., and this could cause damage to the substrate table WT. PLD is described in The Bulletin of the Polish Academy of Sciences, Technical Sciences, Vol. 54, No. 2, 2006. PLD uses a laser to ablate material from a ceramic/metal target, and directs the resulting plume of material onto a substrate (e.g., the substrate table WT). The target may for example be high purity Ti (99.9% Ti) or high purity Cr (99.9% Cr). The laser beam is a pulsed laser beam, and may for example be a Nd:YAG laser operating at 1064 nm with 0.6 J pulse energy and 10 nanosecond pulse duration at a repetition rate of 50 Hz. The pulsed laser beam is focused onto the target in order to evaporate its surface layers via ablation in a vacuum or low-pressure gas environment (e.g., pressure from $10^{-5}$ mbar to 4 Pa). The vaporised material consists of atoms, ions and atomic clusters, and it is this material which is deposited onto the substrate table WT. The substrate table WT may for example be mounted parallel to the target surface. A continuous flow of gas of 30 sccm may be used to transfer the material to the substrate table WT. The substrate table WT may for example be moved through plasma plumes during deposition in order to obtain a homogeneous material thickness over the substrate table. When forming a layer of Ti or Cr, deposition may be performed in an Ar atmosphere. When forming a layer of TiN or CrN, deposition may be performed in a $N_2$ atmosphere.

PLD is able to deposit thin films of various materials with high chemical purity and good adhesion onto different substrate materials at room temperature. When PLD is performed at room temperature it does not damage the AF 32 glass of the substrate table WT, and does not degrade any bonding that has been used during construction of the substrate table WT.

In an alternative embodiment, atomic layer deposition (ALD) may be used to form the multilayer coating 302. Plasma ALD systems are currently available that may be used to form multilayer coatings at a temperature, which is sufficiently low that it does not cause damage to the substrate table WT (for example room temperature). The multilayer coating may for example be formed using a FlexAl ADL system, which is available from Oxford Instruments of Oxfordshire, United Kingdom.

Figure 5:
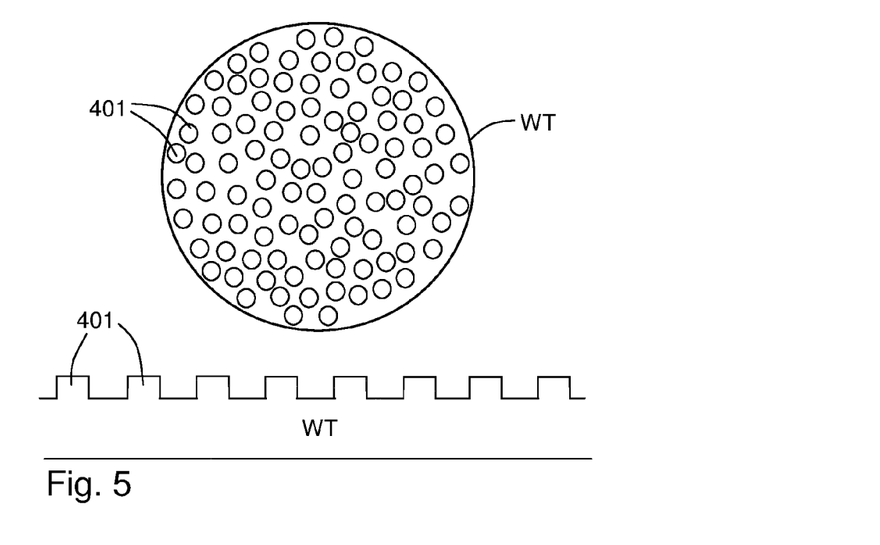
FIG. 5 depicts part of a process of forming a substrate table according to an embodiment of the invention.
Figure 6:
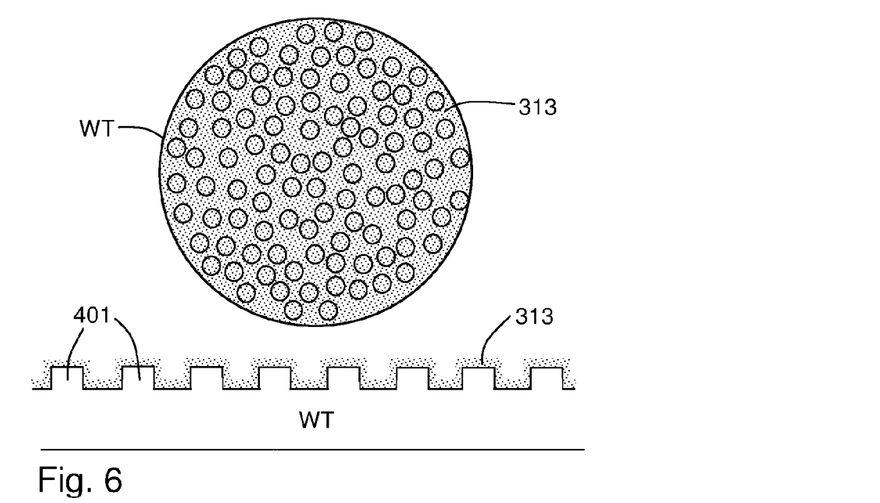
FIG. 6 depicts a further part of the process of forming the substrate table of FIG. 5.
Figure 7:
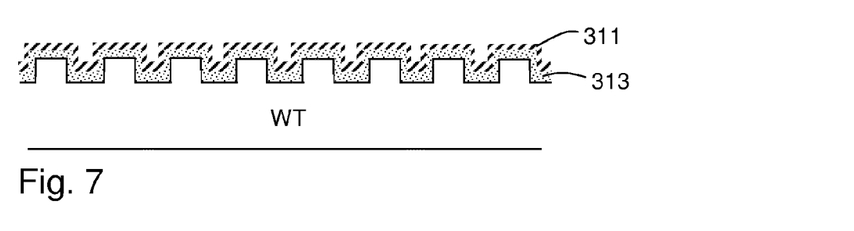
FIG. 7 depicts a further part of the process of forming the substrate table of FIG. 5.

In an example method, schematically shown in FIGS. 5-7, an atomically flat AF 32 glass substrate is etched using a conventional chemical etch process (e.g., a hydrofluoric acid etch) to form burls on the substrate table. The substrate table WT including burls 401 is schematically shown viewed from above and also in cross-section in FIG. 5.

The substrate table WT is placed in a chamber of an ALD machine (e.g., the FlexAl system) in order to allow a multilayer coating to be formed on the substrate table. The substrate table WT is exposed to a first gaseous precursor molecule, which may be an elemental vapour or a volatile compound of the element. The first gaseous precursor molecule may for example be $TiCl_4$, and may be generated by providing $TiCl_4$ in a glass tube which is frozen at liquid nitrogen temperature and evacuated to 1 mTorr. Upon rewarming to room temperature, the $TiCl_4$ vapor from the tube may be passed through a timed vacuum valve into the chamber of the ALD machine to provide a working pressure within the chamber of 30-100 mTorr. The flow of TiCl4 may be allowed to take place for a sufficient period of time that one monolayer of the reactant is chemisorbed onto the surface of the substrate table WT. For example, the substrate table WT may be exposed to $>10^4$ Langmuirs of $TiCl_4$ (1 Langmuir=1 monolayer equivalent flux, which is roughly equal to a pressure of $10^{-6}$ Torr for 1 second). The excess of the reactant, which is in the gas phase or which has been physisorbed onto the surface of the substrate table WT, is then purged out of the chamber by evacuating the chamber (or using an inert gas).

The substrate table WT is then exposed to a second reactant, which may for example be atomic hydrogen. The atomic hydrogen may be generated by providing hydrogen gas in a quartz tube that is connected to the chamber via a gate valve and fed from a hydrogen gas supply via a leak valve. The quartz tube may be wrapped with a multiple-turn coil powered at 13.56 MHz at a power of 300 to 1200 W. At the bottom of the tube a 1-3 mm aperture may be used to limit the atomic hydrogen to the tube Other sources of atomic hydrogen may be used. When the atomic hydrogen is supplied to the chamber, it is chemisorbed onto the surface of the substrate table WT and undergoes an exchange reaction with the first reactant (e.g., $TiCl_4$) on the substrate table surface. This results in the formation of a solid molecular film (e.g., a film of Ti), and a gaseous side product. The flow of atomic hydrogen is stopped after a predetermined time, which is sufficient to allow the chemisorption and exchange reaction to take place across the surface of the substrate table. Thereafter, the chamber is allowed to return to a base pressure.

Physisorption refers to binding of a substance to a surface via weak van der Waal's forces. Chemisorption involves the formation of relatively strong chemical bonds between a material and a surface, which may require an activation energy. The activation energy may be provided by heating the substrate to a desired temperature (although ALD may be performed at room temperature). Because ALD uses chemisorption, the ALD process is self-controlling and is insensitive to pressure and substrate changes, and only one atomic or molecular layer can be absorbed on to a surface at a time.

The ALD process provides a single atomic or molecular layer of the desired material (in this case Ti) on the surface of the substrate table WT. ALD deposition may thus be considered to be self-limiting because only one atomic or molecular layer of the desired material is provided on the surface of the substrate table WT. The process may be repeated a desired number of times in order to provide a layer of material (e.g., Ti) that has a desired thickness. The self-limiting nature of the ALD process allows tight control of the thickness of layers formed using ALD. FIG. 6 schematically shows the substrate table WT with an upper surface that has been provided with a layer of Ti 313 having a desired thickness. Since the thickness of the layer of Ti 313 is tightly controllable, the layer may for example have a thickness that is less than 30 nm. The layer may for example have a thickness that is greater than 30 nm.

Once the first layer 313 of the multilayer coating has been formed, a second layer of the multilayer coating may then formed using ALD. The second layer may for example be formed from TiN, using the process described above in relation to the first layer. In this instance, the precursors for the TiN layer may be TiCl4 and NH3. Other precursors that may be used for the TiN layer are listed in Table 9.5 on page 424 of Chemical Vapour Deposition Precursors, Processes and Applications, edited by A. C. Jones and M. L. Hitchman, published by RSC Publishing. Since the thickness of the layer of TiN is tightly controllable, the layer may for example have a thickness which is less than 30 nm. The layer may for example have a thickness which is greater than 30 nm.

FIG. 7 schematically shows the substrate table WT with an upper surface that has been provided with a single layer of Ti 313 and a single layer of TiN 311.

A series of layers may be formed on the substrate using ALD until a multilayer coating having a desired number of layers has been formed. When forming the uppermost layer of the multilayer coating, more iterations of the ALD process may be used in order to make the final layer of the multilayer coating thicker than other layers (if a thicker final layer is desired).

ALD provides the advantage that it may form a very flat surface, thereby reducing or eliminating overlay errors due to non-flatness of the substrate table WT.

An advantage of forming a multilayer coating 302 on the substrate table WT using ALD is that the coating may increase the mean flexural strength and the Weibull modulus of the substrate table WT.

Forming the multilayer coating 302 using ALD may be relatively slow. However, the throughput of the ALD process may be improved by coating a plurality of substrate tables at the same time using the same ALD chamber.

Sticking between the substrate W and the substrate table WT may cause the wafer to deform. Deforming of the substrate W may for example occur during clamping of the substrate to the substrate table WT if adhesion between the substrate and substrate table prevents movement of the substrate relative to the substrate table. The adhesion between the substrate W and the substrate table WT will depend upon the material used to form the upper layer 311 of the multilayer coating 302, and will also depend upon the roughness of the surface of the upper layer.

It is desirable to provide the upper surface of the multilayer coating 302 with a surface roughness in order to avoid an undesirable amount of adhesion between the substrate W and the substrate table WT, whilst at the same time maintaining a high flatness of the surface of the substrate table. In this context, adhesion may be considered to mean force that inhibits movement of the substrate W over the substrate table WT, and includes van der Waals forces acting between the substrate and the substrate table. Providing the upper surface of the multilayer coating 302 with a roughness reduces van der Waals forces acting between the substrate and the substrate table.

In an embodiment of the invention, once the multilayer coating 302 has been formed (using for example PLD or ALD), then plasma etching may be used to provide the upper surface of the multilayer coating 302 with a desired roughness. The plasma etching may for example be inductively coupled plasma etching, reactive ion etching or plasma assisted chemical etching.

In order to provide roughness using the plasma etching, a pattern having a pitch that corresponds with the desired pitch of the roughness may first be projected onto a resist applied to the substrate table WT (e.g., using a lithographic apparatus). The resist may then be developed, and a selective plasma etch may then be used which etches through unexposed portions of the resist and etches into the upper layer of the multilayer coating. In this way the plasma etch will etch into the upper layer a pattern which provides a desired roughness. The pitch of the pattern which provides the roughness may for example 11e in the range 3-7 nm, or may have some other suitable value. After etching the resist is removed, for example using acetone.

Plasma etching has the advantage that it provides the upper surface of the multilayer coating 302 with a substantially uniform roughness, thereby avoiding problems that may arise if different roughnesses are provided at different locations on the substrate table WT (as may for example be the case if polishing were used to obtain the surface roughness).

As mentioned above, the plasma etching may for example be inductively coupled plasma etching. This may be performed for example using a Centura-DPS apparatus, available from Applied Materials Inc. of Santa Clara, USA. The plasma may for example be $Ar/CHF_3$, $Ar/Cl_2$ or $Ar/BCl_3$. Of these, $Ar/Cl_2$ may be the most effective for obtaining a high etching rate and non-tapered etching profile. The etching apparatus may for example use a plasma source excited by 13.56 MHz RF electricity. The power provided at an upper electrode may for example be 1000 W and the power provided at a lower electrode may, for example, be 85 W. Total gas flow during the etching may for example be 120 sccm, and the temperature of the lower electrode may for example be 85° C. Inductively coupled plasma etching is described in "Dry etching characteristics of TiN film using $Ar/CHF_3$, $Ar/Cl_2$, and $Ar/BCl_3$ gas chemistries in an inductively coupled plasma," by J. Tonotani et. al., J. Vac. Sci. Technol. 2163, B 21(5), September/October 2003.

As mentioned above, the plasma etching may for example be reactive ion etching. This may for example be performed using an STS 320 reactive ion etching system, available from SPTS of Newport, United Kingdom. The gas used to generate the plasma used for the etching may for example be $CF_4$ (e.g., 28 sccm) with $O_2$ (e.g., 2 sccm), or may for example be $CHF_3$ (e.g., 28 sccm) with $O_2$ (e.g., 2 sccm). The small amount of $O_2$ may help to reduce the accumulation of fluorocarbon residue during etching. The plasma source of the apparatus may for example be excited by 13.56 MHz RF electricity, applied with a power in the range 200-400 W. The cathode of the apparatus may for example be continuously cooled to 20° C. using a re-circulating fluid. The chamber that the substrate table is placed may for example be held at a constant pressure of 50 mTorr. Reactive ion etching is described in "Reactive ion etching of TiN, TiAlN, CrN and TiCN Films in $CF_4/O_2$ and $CHF_3/O_2$ Plasmas," by P. W. Leech et al, Mater. Res. Soc. Symp. Proc. Vol. 890, 2006 Materials Research Society.

As mentioned above, the plasma etching may for example be plasma assisted chemical etching (PACE). PACE was developed by the Perkin-Elmer Corporation of Connecticut, USA in 1985 as a non-mechanical process capable of shaping and polishing optical surfaces. However, in an embodiment of the invention PACE is used to provide the surface of the multilayer coating 302 with a desired roughness rather than polishing the surface. In PACE a plasma-excited reactive gas chemically combines with the surface of a material being etched to generate a volatile product that removes a predictable and controllable amount of the surface. If the surface of the multilayer coating is TiN then the plasma may for example be $CF_4/O_2$ or $CHF_3/O_2$. If the surface of the multilayer coating is CrN then the plasma may for example be $CF_4/O_2$. The apparatus used to provide plasma assisted chemical etching may for example be as described in U.S. Pat. No. 5,298,103, which is herein incorporated by reference.

In an embodiment, PACE may be used to remove material from a surface upon which resist has been used to provide a pattern (as described further above). Alternatively, PACE may be used to apply roughness to the surface without using a pattern provided in resist. PACE is capable of providing localised etching, and thus may be programmed to provide etching to varying depths at different locations. The depth of etching as a function of location may be selected to provide a desired roughness.

Plasma etching may be used to provide the upper surface of a single layer coating with a desired roughness.

Figure 8:
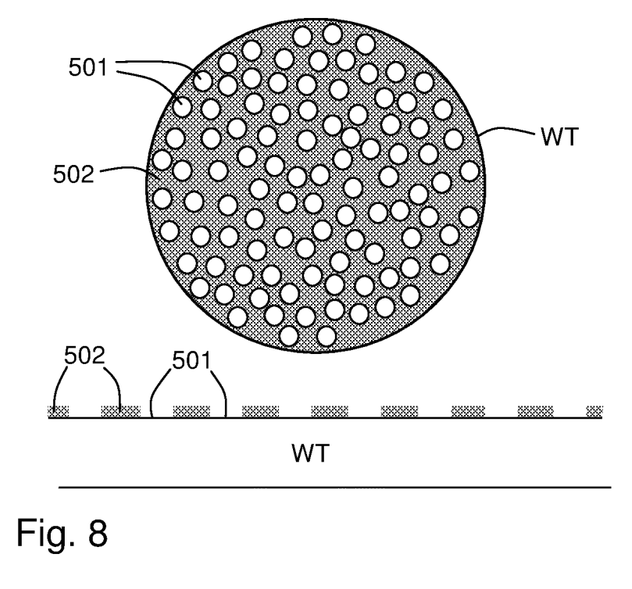
FIG. 8 depicts part of a process of forming a substrate table according to an alternative embodiment of the invention.
Figure 9:
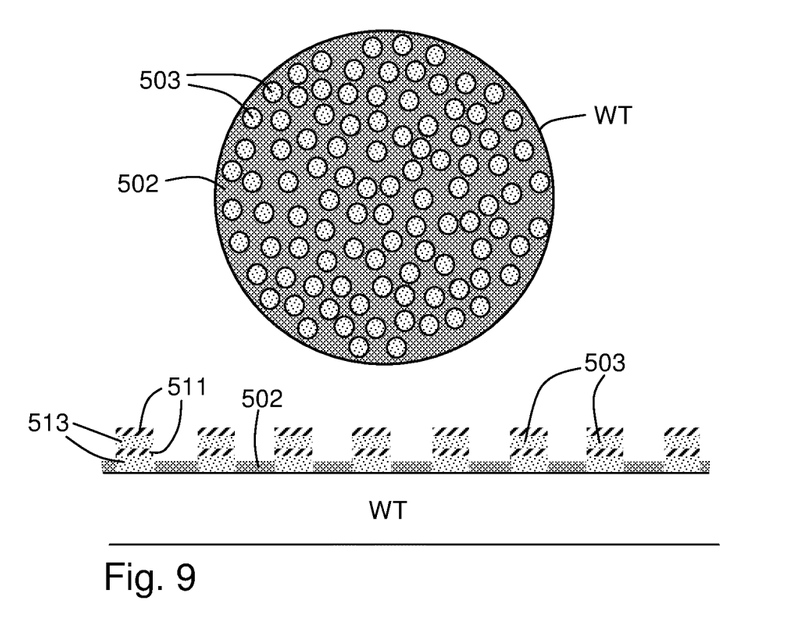
FIG. 9 depicts a substrate table formed using the process of FIG. 8.

An alternative method of providing the substrate table with a multilayer coating is shown schematically in FIGS. 8 and 9. In this method the layers are not merely used to form a coating on the burls, but are used to form the burls themselves.

Referring to FIG. 8, an upper surface of the substrate table WT is provided with ALD-philic sites 501 surrounded by ALD-phobic regions 502. The term ALD-phobic maybe interpreted as referring to a surface upon which layers will not be formed by the ALD process. The term ALD-philic may be interpreted as meaning as a surface upon which layers may be formed using the ALD process. This configuration is achieved by forming an ALD-phobic layer on the substrate table WT, and then etching through the ALD-phobic material at desired locations such that the AF 32 glass of the substrate table WT is exposed at those locations (using a material dependent plasma etch). The AF 32 glass is ALD-philic, and etching through the ALD-phobic material therefore provides the configuration shown in FIG. 8. Formation of ALD-phobic regions is described in "Blocking the Lateral Film Growth at the Nanoscale in Area-Selective Atomic Layer Deposition," by Robin H. A. Ras, Elina Sahramo, Jari Malm, Janne Raula, and Maarit Karppinen, J. AM. CHEM. SOC. 2008, 130, 11252-11253.

In an embodiment, the ALD-phobic material may be formed by providing a polymer film on the substrate table WT. The polymer film may be patterned using lithography such that areas where burls are not to be formed are exposed to radiation, causing the polymer to cross-link and form solid regions. The unexposed polymer may then be removed from the substrate table WT, thereby leaving openings where burls are to be formed. Self-assembled monomers may then be applied to the substrate table WT, the self-assembled monomers adhering to the surface of the solid regions but not adhering to the openings where burls are to be formed. This is because the self-assembled monomers are functionalised such that they only adhere to the solid regions. The self-assembled monomers may be ALD-phobic, inhibiting ALD chemistry at locations where the self-assembled monomers are provided. This prevents the formation of material layers using ALD such that ALD may be used to form burls in the openings. Selective patterning of a substrate using ALD-phobic materials is described in "Blocking the Lateral Film Growth at the Nanoscale in Area-Selective Atomic Layer Deposition," by Robin H. A. Ras, Elina Sahramo, Jari Malm, Janne Raula, and Maarit Karppinen, 11252 9 J. AM. CHEM. SOC. 2008, 130, 11252-11253

Once the substrate table WT has been provided with ALD-philic sites 501 surround by ALD-phobic regions 502, the substrate is placed in a chamber of an ALD apparatus (e.g., the FlexAl system). A first layer of a multilayer structure, for example a layer of Ti 513, is formed on the ALD-philic sites 501 using the ALD process described above. A layer of TiN 511 is then formed on top of the layer of Ti 513 using the ALD process. This is continued until multilayer structures have been formed on the substrate table WT, which have a height that is sufficient to allow the multilayer structures to act as burls. This is shown schematically in FIG. 9, with burls 503 being formed by layers 513 of Ti and layers 511 of TiN. Although two layers of Ti 513 and two layers of TiN 511 are shown, the burls may comprise any suitable number of layers. The burls 503 may for example have a height of a around 10 microns (or some other suitable height). Formation of TiN and Ti films using ALD is described in US2004/221798, which is herein incorporated by reference, which is incorporated herein by reference.

Once the upper layer of the burls 503 has been formed, plasma assisted chemical etching may be used to provide an upper surface of the burls with a desired roughness.

In an embodiment, the burls may be partially formed from AF 32 glass, and may be extended in height using the ALD process described above.

An advantage of TiN, Ti, CrN and Cr is that these materials do not provide significant amounts of outgassing, and thus will not degrade a vacuum present in an EUV lithographic apparatus.

In the above described embodiments the substrate table WT is formed from AF 32 glass. AF 32 glass is useful in lithography applications because it has a coefficient of thermal expansion which matches that of silicon, and can withstand heat of up to approximately 600° C. (although glue used in the construction of the substrate table WT may be damaged at that temperature). However, the substrate table may be formed from some other suitable glass or from some other suitable non-glass material.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multilayer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens," where the context allows, may refer to any one or combination of various types of optical components, including refractive, reflective, magnetic, electromagnetic and electrostatic optical components.

The term "EUV radiation" may be considered to encompass electromagnetic radiation having a wavelength within the range of 5-20 nm, for example within the range of 13-14 nm, for example, within the range of 5-10 nm such as 6.7 nm or 6.8 nm.

In an embodiment there is provided a method of forming a multilayer coating on a substrate table. This method comprising using pulsed laser deposition at or near to room temperature to form a layer of a first material on the substrate table. Then pulsed laser deposition is used at or near to room temperature to form a layer of a second material on top of the layer of the first material Then pulsed laser deposition is optionally used at or near to room temperature to form additional layers of material on the substrate table.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein. The descriptions above are intended to be illustrative, not limiting. Thus, it will be apparent to one skilled in the art that modifications may be made to the invention as described without departing from the scope of the claims set out below.

What is claimed is:

1. A substrate table comprising:
   a base;
   a plurality of burls formed at atomic layer deposition (ALD)-philic sites by a multilayer coating so as to project from the base, wherein the multilayer coating includes layer to layer interfaces at which energy may dissipate; and
   a plurality of ALD-phobic sites located between the ALD-philic sites and thus between the multilayer coating burls formed at the ALD-philic sites.

2. The substrate table of claim 1, wherein the multilayer coating comprises at least one layer of Ti and at least one layer of TiN.

3. The substrate table of claim 2, wherein an upper layer of the multilayer coating is formed from TiN.

4. The substrate table of claim 1, wherein the multilayer coating comprises at least one layer of Cr and at least one layer of CrN.

5. The substrate table of claim 4, wherein an upper layer of the multilayer coating is formed from CrN.

6. The substrate table of claim 1, wherein the multilayer coating comprises 10 or more layers.

7. The substrate table of claim 1, wherein the multilayer coating has a thickness greater than 100 nm.

8. The substrate table of claim 1, wherein in addition to being provided on the burls, the multilayer coating is provided on regions of the substrate table that are located between the burls.

9. The substrate table of claim 1, wherein a roughness is applied to an upper surface of the multilayer coating using plasma etching or plasma assisted chemical etching.

10. A lithographic apparatus comprising the substrate table of claim 1.

11. A device manufacturing method comprising projecting a patterned beam of radiation onto a substrate held on a substrate table according claim 1.

12. The substrate table of claim 1, wherein the burls are pillars that are substantially parallel to each other and substantially perpendicular to the base.

13. A method of forming a multilayer coating on a substrate table, the method comprising:

forming atomic layer deposition (ALD)-philic sites;

forming ALD-phobic sites between the ALD-philic sites; and using atomic layer deposition to selectively form a plurality of multilayer pillar-shaped burls on a base at the ALD-philic sites, wherein the burls comprise layers of Ti and layers of TiN or layers of Cr and layers of CrN, thereby providing the multilayer coating with layer to layer interfaces at which energy may dissipate.

14. The method of claim 13, wherein an upper surface of the multilayer coating is etched using plasma etching to provide the upper surface with a substantially uniform roughness.

15. The method of claim 13, wherein the burls are formed as pillars that are substantially parallel to each other and substantially perpendicular to the base.

* * * * *